United States Patent [19]

Scudder et al.

[11] Patent Number: 5,198,071
[45] Date of Patent: Mar. 30, 1993

[54] PROCESS FOR INHIBITING SLIP AND MICROCRACKING WHILE FORMING EPITAXIAL LAYER ON SEMICONDUCTOR WAFER

[75] Inventors: Lance Scudder, Mountain View; Norma Riley, Pleasanton, both of Calif.

[73] Assignee: Applied Materials, Inc., Santa Clara, Calif.

[21] Appl. No.: 797,614

[22] Filed: Nov. 25, 1991

[51] Int. Cl.$^5$ .............................................. B44C 1/22
[52] U.S. Cl. ................................ 156/625; 437/108; 437/112; 437/13; 437/248; 437/939; 437/946; 148/DIG. 24; 148/DIG. 17; 156/654
[58] Field of Search ................... 437/84, 85, 108, 112, 437/131, 13, 248, 939, 946; 148/DIG. 17, DIG. 24, DIG. 127; 156/345, 654, 625

[56] References Cited

U.S. PATENT DOCUMENTS

| | | | |
|---|---|---|---|
| 4,256,520 | 3/1981 | Koike et al. | 437/946 |
| 4,659,400 | 4/1987 | Garbis et al. | 437/228 |
| 4,728,389 | 3/1988 | Logar | 437/225 |
| 4,745,088 | 5/1988 | Inoue et al. | 437/102 |
| 4,780,174 | 10/1988 | Lan et al. | 118/728 |
| 4,874,464 | 10/1989 | Goodwin et al. | 156/654 |
| 4,986,215 | 1/1991 | Yamada et al. | 118/728 |
| 5,011,789 | 4/1991 | Burns | 437/108 |

*Primary Examiner*—Brian E. Hearn
*Assistant Examiner*—Tuan Nguyen
*Attorney, Agent, or Firm*—John P. Taylor

[57] ABSTRACT

A process for the formation of an epitaxial layer on a semiconductor wafer is described which inhibits the formation of thermal stress in the semiconductor wafer such as a silicon wafer, during the formation of such an epitaxial layer thereon. In one aspect, such thermal stress is inhibited during the deposition of the epitaxial material by initially reducing the deposition rate to less than 1 $\mu$m per minute or lower until the epitaxial layer reaches a thickness of from about 2 to about 30 $\mu$m. In another aspect of the invention, any bridge materials formed between the wafer and the wafer support, during formation of the epitaxial layer, is removed before the wafer is cooled, i.e., before such bridge materials can induce thermal stress in the wafer during the cooling of the wafer, by post etching the wafer with HCl etching gas after the epitaxial deposition.

24 Claims, 3 Drawing Sheets

```
┌─────────────────────────────────────┐
│  GROWING AN EPITAXIAL LAYER OF A    │
│  SEMICONDUCTOR MATERIAL ON A        │
│  SEMICONDUCTOR WAFER AT AN INITIAL  │
│  RATE OF LESS THAN 1 MICROMETER     │
│  PER MINUTE UNTIL FROM ABOUT 2 TO   │
│  30 MICROMETERS OF THE EPITAXIAL    │
│  LAYER HAVE BEEN DEPOSITED          │
└─────────────────────────────────────┘
                    │
                    ▼
┌─────────────────────────────────────┐
│  THEN GROWING THE REMAINDER OF THE  │
│  EPITAXIAL LAYER AT A RATE OF AT    │
│  LEAST 1 MICROMETER PER MINUTE UNTIL│
│  THE DESIRED THICKNESS OF THE       │
│  EPITAXIAL LAYER HAS BEEN GROWN     │
└─────────────────────────────────────┘
                    │
                    ▼
┌─────────────────────────────────────┐
│  ETCHING THE WAFER FOR FROM ABOUT 1 │
│  MINUTE TO ABOUT 15 MINUTES AFTER   │
│  THE DEPOSITION WHILE MAINTAINING THE│
│  WAFER AT THE DEPOSITION TEMPERATURE│
│  TO REMOVE ANY BRIDGING MATERIALS   │
│  BETWEEN THE WAFER AND THE WAFER    │
│  SUPPORT WHICH MAY HAVE DEPOSITED   │
└─────────────────────────────────────┘
```

GROWING AN EPITAXIAL LAYER OF A SEMICONDUCTOR MATERIAL ON A SEMICONDUCTOR WAFER AT AN INITIAL RATE OF LESS THAN 1 MICROMETER PER MINUTE UNTIL FROM ABOUT 2 TO 30 MICROMETERS OF THE EPITAXIAL LAYER HAVE BEEN DEPOSITED

THEN GROWING THE REMAINDER OF THE EPITAXIAL LAYER AT A RATE OF AT LEAST 1 MICROMETER PER MINUTE UNTIL THE DESIRED THICKNESS OF THE EPITAXIAL LAYER HAS BEEN GROWN

ETCHING THE WAFER FOR FROM ABOUT 1 MINUTE TO ABOUT 15 MINUTES AFTER THE DEPOSITION WHILE MAINTAINING THE WAFER AT THE DEPOSITION TEMPERATURE TO REMOVE ANY BRIDGING MATERIALS BETWEEN THE WAFER AND THE WAFER SUPPORT WHICH MAY HAVE DEPOSITED

FIG. 3

PROCESS FOR INHIBITING SLIP AND MICROCRACKING WHILE FORMING EPITAXIAL LAYER ON SEMICONDUCTOR WAFER

BACKGROUND OF THE INVENTION

1. Field of the Invention

This invention relates to the formation of an epitaxial layer on a semiconductor wafer. More particularly, this invention relates to a process wherein slip and microcracking are inhibited during formation of an epitaxial layer on a semiconductor wafer.

2. Description of the Related Art

During the formation or growth of an epitaxial layer of semiconductor material on a semiconductor wafer, i.e., the growth of an epitaxial silicon layer on a single crystal silicon wafer, thermal stresses may occur in the wafer, during subsequent cooling of the wafer.

Conventionally a semiconductor wafer, during growth of an epitaxial layer thereon in a deposition chamber, rests on a support member or susceptor which usually comprises some other type of material, for example, a silicon carbide coated graphite material when the wafer is a silicon wafer. During the deposition of, for example, silicon on a silicon wafer resting on such a support, a pinning site or bridge of the growth material may form or deposit between the wafer and the support at a contact point between the wafer and support. When the wafer is in a vertical, or near vertical, position in the deposition chamber such a point contact may occur where the end edge of the wafer rests on the side-wall of the susceptor pocket.

When such a bridge or pinning site forms at this point during the deposition, subsequent cooling of the wafer and susceptor after the deposition may induce thermal stress in the wafer at this point because of the differences between the thermal coefficients of expansion of the wafer and susceptor.

This tendency to grow such a bridge, and the inducement of thermal stress in the wafer due to such occurrence, becomes particularly acute when thick epitaxial layers are grown on a semiconductor wafer, i.e., epitaxial layers of 50 $\mu$m or more in thickness. If either the primary or a secondary flat on the wafer is at the bottom of the wafer, as it is positioned in the susceptor pocket, the problem of bridge formation may be exacerbated.

The thermal stress, which occurs as the wafer and susceptor cool, usually becomes great enough that the bridge fractures before ambient temperature is reached. However, evidence of the formation of the bridge can usually be detected by subsequent examination of the wafer under a microscope such as a Nomarski Phase Contrast microscope at about 20x.

Prior to the fracturing of the bridge, the thermal stress induced in the relatively thin wafer, at the point where the cooling wafer is connected to the susceptor through this bridge, may result in the occurrence of either microcracking or a slip or both in the wafer.

Microcracking, as shown in FIG. 1 at 2, is a small crack or fracture of the wafer which usually extends inwardly a short distance, e.g., about 1–10 millimeters (mm), from the point of thermal stress shown at 4 at the end edge of the wafer, although cracking across the entire diameter of the wafer is not unknown. Usually, the amount of thermal stress induced in the wafer by such bridge formation will not be sufficient to result in microcracking unless the thickness of the epitaxial layer exceeds about 50 micrometers ($\mu$m).

Slip or slippage, illustrated at 8 in FIG. 2, may be defined as a fracture or disruption of the parallel planes of atoms, comprising epitaxial layer 12 on single crystal wafer 10, into adjoining planes separated by a fault line, i.e., adjacent atoms in the respective planes on both sides of the fault line are no longer coplanar. Although not illustrated, the slip may continue into the wafer itself, as well.

Such slippage and/or microcracking can result in rendering the wafer useless for subsequent processing to form integrated circuit structures; or at least result in the formation of defects in integrated circuit structures formed in the wafer in those regions where such slippage and/or micro-cracking has occurred.

It would, therefore, be desirable to eliminate this cause of thermal stress induced in the wafer, either by inhibiting formation of such a pinning site or bridge, or by removing the pinning site or bridge, after its formation, but prior to cooling of the wafer, i.e., prior to the inducement of thermal stress in the wafer by the existence of such a bridge.

SUMMARY OF THE INVENTION

The invention comprises a process for inhibiting the formation of thermal stress in a semiconductor wafer after epitaxial growth thereon by either inhibiting the formation of a bridge or pinning site between the wafer and the susceptor during the epitaxial growth; or removing such a bridge or pinning site prior to cooling of the wafer and susceptor, i.e., before inducing thermal stress in the wafer; or by the practice of both inhibiting formation of bridging materials and removing any such materials which do deposit.

Initial formation of such an undesired bridge between the semiconductor wafer and the susceptor may be inhibited by slowing the deposition and growth rate of the epitaxial layer from a normal rate of 1 to about 3 $\mu$m per minute, typically about 1–2 $\mu$m per minute, down to from about 0.1 to less than 1 $\mu$m per minute, while removal of any bridging material may be accomplished by an HCl etching step carried out after the deposition step, but prior to cooling of the wafer and susceptor below the epitaxial deposition temperature. Both inhibition of such bridge formation and removal of any bridging materials formed between the wafer and the susceptor may be carried out together to ensure that such undesired thermal stress is not induced in the wafer and to, therefore, further reduce any likelihood that either microcracking or slip will occur in the wafer.

BRIEF DESCRIPTION OF THE DRAWINGS

FIG. 3 is a flowsheet illustrating both aspects of the process of the invention for inhibiting thermal stress in a semiconductor wafer having an epitaxial layer formed thereon.

DETAILED DESCRIPTION OF THE INVENTION

The process of the invention reduces the severity of thermal stress in a semiconductor wafer such as a silicon wafer, during the formation of an epitaxial layer thereon. In one aspect, the thermal stress is inhibited during the deposition of the epitaxial material by initially reducing the deposition rate to thereby inhibit formation of a bridge between the wafer and the wafer support at the point of contact between the two. In another aspect of the invention, any bridge formed between the wafer and the wafer support is removed before the wafer is cooled below the epitaxial deposition temperature, i.e., before such a bridge can induce thermal stress in the wafer during the cooling of the wafer.

When both the initial reduction of the deposition rate and the post deposition etching are used together, the low growth nucleation induced by the lower initial deposition rate not only inhibits formation of the unwanted bridge, but also facilitates removal, during the post deposition etching step, of any bridging materials which do form during the deposition because any bridge formed will be less well developed. In other words, the two aspects of the process cooperate with one another when used together.

It should be noted that the thermal stress-induced microcracking is usually not observed unless an epitaxial layer of at least about 50 $\mu$m is deposited. However, slip induced by such thermal stress can occur even when thinner epitaxial layers are grown. Slip caused by thermal stress may be observed with epitaxial layers grown as thin as 5–10 $\mu$m.

Figure 4:
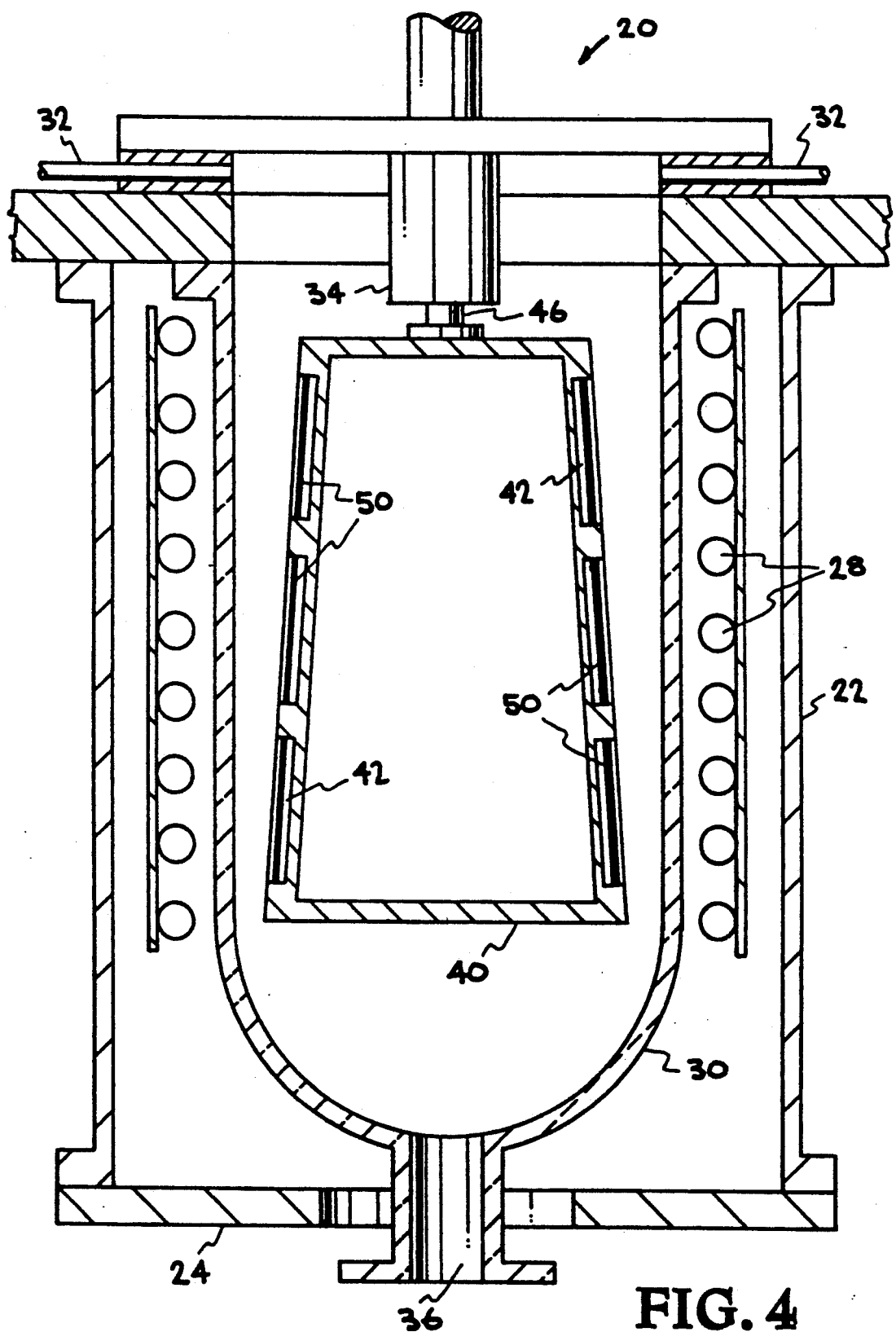
FIG. 4 is a side section view of apparatus suitable for use in the practice of the process of the invention.

Turning now to FIG. 4, a typical epitaxial deposition apparatus which may be used in the practice of the process of the invention is illustrated. A deposition apparatus 20, which includes outer wall 22 and a base 24, contains a series of radiant heaters 28 surrounding a quartz deposition chamber 30 in apparatus 20. Generally vertical mounted within quartz chamber 30 is a polysided (polygon-shaped in cross-section) susceptor 40 on which a plurality of generally circular semiconductor wafers 50 are mounted. Rotational means (not shown), external to chamber 30, may be provided to rotate susceptor 40 in chamber 30 via quartz hanger 46 which extends from susceptor 40 through the top wall of chamber 30.

Quartz chamber 30 is further provided with main gas inlet ports 32 adjacent the top of the sidewalls of chamber 30 through which the deposition gas, together with a carrier gas, may be flowed into chamber 30. Chamber 30 may be optionally provided additionally with a central gas inlet port 34 through which further carrier gas, sometimes referred to as rotational gas, may be flowed. The purpose of rotational carrier gas flow into chamber 30 through central gas inlet port 34 is to purge the rotational mechanism to reduce the chance of reactant gases (flowing from the deposition chamber) entering the rotational mechanism. All of the gases then flow to an exit port 36 located at the bottom of chamber 30 through which chamber 30 may be connected to an evacuation pump (not shown).

Figure 1:
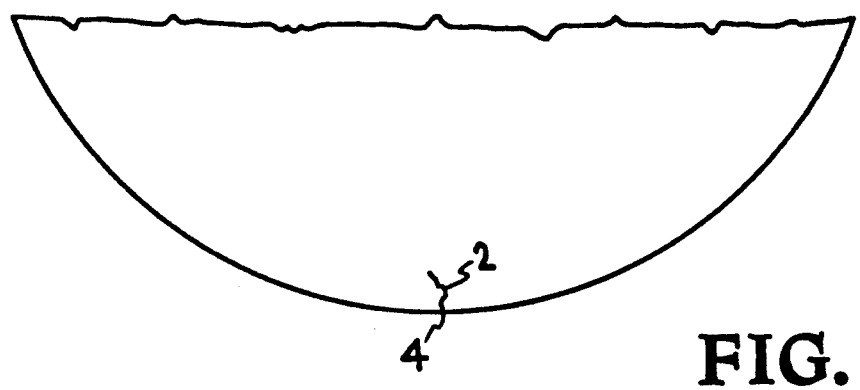
FIG. 1 is a fragmentary top view of a portion of a silicon wafer, after epitaxial deposition of a silicon layer thereon in accordance with the prior art, showing a microcrack extending inwardly from the end edge of the wafer.
Figure 2:
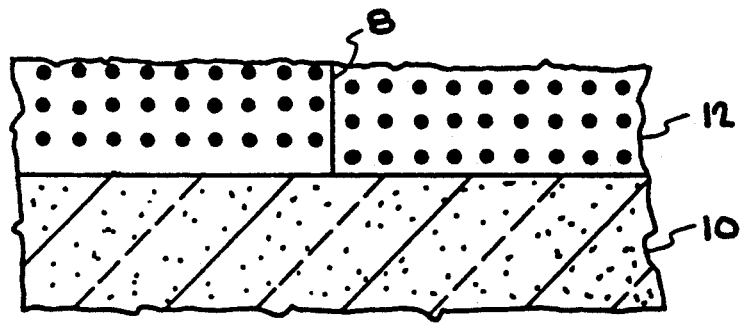
FIG. 2 is a fragmentary side section view of a silicon wafer, after epitaxial deposition of a silicon layer thereon in accordance with the prior art, showing a slip between adjacent planes of atoms.
Figure 5:
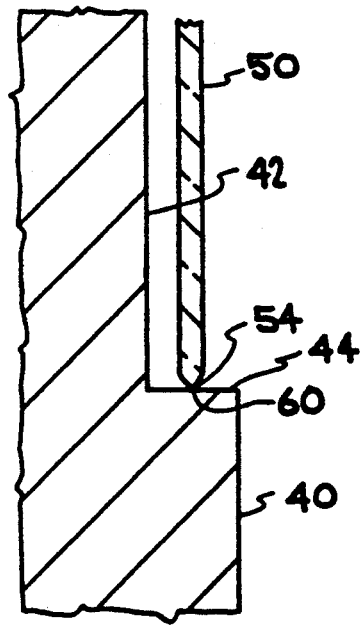
FIG. 5 is a fragmentary vertical view of a portion of FIG. 4 showing the point contact between the end edge of the wafer, at the bottom of the wafer, and the sidewall of the susceptor pocket in which the wafer rests during the deposition.

Wafers 50 are mounted on susceptor 40 in generally circular recesses or pockets 42 which are formed in the sidewalls or faces of susceptor 40. As more easily seen in FIG. 5, wafer 50 is received in pocket 42 of susceptor 40 with end edge 54 of wafer 50 making contact with sidewall 44 of pocket 42 at point 60. It is at this point of contact where a bridge may form between susceptor 34 and wafer 40 during the deposition.

To form the desired epitaxial layer on the surface of the wafer, the wafer or wafers are first loaded into the pockets 42 on susceptor 40 in chamber 30. Carrier gas then is flowed through chamber 30 via gas inlets 32 and 34, while the wafers 50 and susceptor 40 are heated to the desired deposition temperature via radiant heaters 28. When wafers 50 reach the desired deposition temperature, as monitored, for example, by infrared detectors (not shown), deposition gas is flowed into chamber 30, in accordance with one aspect of the invention at a low initial flow rate, as will be explained below, followed by flow at a higher rate.

For growth of an epitaxial layer of silicon on a silicon wafer, chlorinated silanes, such as silicon-tetrachloride ($SiCl_4$), trichlorosilane ($SiHCl_3$), and dichlorosilane ($SiH_2Cl_2$) are conventionally used, although it will be understood that any source of silicon normally used in such growth of epitaxial silicon may be used in accordance with the practice of the invention.

Whatever source of silicon gas is used, the purity of the gas is very important to the quality of the epitaxial layer of silicon to be deposited. Generally the source of silicon gas should be of at least semiconductor grade purity, i.e., 99.99% pure.

The temperature at which the epitaxial deposition takes place will vary with the type of deposition gas used, but will generally range from about 800° C. to about 1250° C. When a chlorinated silane such as trichlorosilane ($SiHCl_3$) or silicontetrachloride ($SiCl_4$) is used as the deposition gas, the temperature of the wafer during the deposition is generally maintained within a range of from about 1150° C. to about 1250° C., and preferably about 1150° C. to about 1180° C. When the chlorine content of the deposition gas is lowered, the wafer temperature may be lowered. For example, if dichlorosilane ($SiH_2Cl_2$) is used, the wafer temperature during the deposition may be maintained at from about 1000° C. to about 1100° C.

The pressure in the deposition chamber will normally be maintained at about atmospheric pressure, however lower pressures, down to about 80 Torr could be used, if desired.

The deposition gas is flowed into the chamber together with a carrier gas which preferably comprises hydrogen gas. Hydrogen is the carrier gas of choice due to the commercial availability of high purity hydrogen at economical rates. By high purity is meant semiconductor grade purity, i.e. 99.9999% pure hydrogen. Other carrier gases may be used, however, provided that they have the required degree of purity and that they do not interfere with either the epitaxial growth or subsequent processing steps.

The flow of the carrier gas into the deposition chamber through main gas inlets 32 will generally range, for a chamber of about 70 liter volume, from about 5 to as much as 250 standard liters per minute (slm), depending upon the deposition gas flow and the amount of desired dilution of the deposition gas. For larger or smaller chambers, the gas flow may be adjusted accordingly, if needed. As mentioned earlier, to guide the total gas flow downwardly through the chamber, additional carrier gas may be optionally admitted into the deposition chamber via central inlet port 34. Such a rotational carrier gas will flow into the chamber at a rate of from 0 to 100 slm.

In accordance with one aspect of the invention, the deposition gas is initially flowed into the deposition chamber at a rate which will permit growth of the epitaxial layer at a rate from about 0.1 $\mu$m per minute to less than about 1.0 $\mu$m thickness per minute for at least about the first 2 to about 30 $\mu$m of film growth, i.e., for from about 2 to about 40 minutes of the initial deposition.

While we do not wish to be bound by any particular theories of operation, this deposition rate appears to affect the formation of nucleation sites which affect the crystal growth of the epitaxial layer of crystalline semiconductor, e.g., silicon, in a manner in which simultaneous deposition of bridging materials between the wafer and the susceptor is inhibited and any bridging materials which are formed are weaker, causing them to be more easily removed, as will be discussed below. This is because subsequent epitaxial growth tends to replicate the nucleation growth. Therefore, well controlled nucleation leads to well controlled epitaxial growth.

After expiration of this minimum growth period, the rate of deposition may be increased (for economical reasons) up to from 1 $\mu$m thickness per minute to about 3 $\mu$m thickness per minute, preferably from 1 $\mu$m per minute up to about 2 $\mu$m per minute, by increasing the flow of deposition gas into the chamber. It has been found that this subsequent increase in deposition rate does not change the type of crystalline structure initially induced by the use of the lower deposition rate unless some higher epitaxial growth rate is utilized which will wash out the nucleation instigated during the initial low growth step. That is, the same crystalline structure continues to form from the nucleation sites, despite the increase in the deposition rate.

The growth rate will be controlled by the concentration of deposition gas in the deposition chamber. The concentration of the deposition gas will, in turn, be controlled by either the flow of deposition gas, or carrier gas, or both, into the chamber. The absolute rate of flow of the deposition gas, with respect to deposition rate, will, in turn, be affected by the total number of wafers in the chamber, as well as the size (diameter) of the wafers and other factors such as chamber size, amount of dilution of the gas by the carrier gas, temperature, pressure, etc.

For example, for a deposition chamber of about 70 liters having a total of 18 wafers loaded therein, each having a diameter of 5 inches, with a hydrogen carrier gas flow of from about 50 slm to about 70 slm, the flow of a deposition gas such as trichlorosilane into the deposition chamber will range from about 1 slm to about 14 slm, during the initial low deposition phase. The deposition gas flow rate should then be increased up to from about 15 slm to about 40 slm for the balance of the deposition time. The total time of the deposition will vary depending upon the deposition rate and the desired thickness of the epitaxial layer being grown on the wafer. For larger or smaller chambers, with more wafers or less wafers, or different size wafers, the above gas flows may be adjusted accordingly.

When such low initial growth or deposition rate is practiced, in accordance with the invention, it has been found that the occurrence of slip can be substantially inhibited and in some cases completely eliminated, particularly when the total thickness of the epitaxial layer is less than about 50 $\mu$m. The practice of this aspect of the invention can have the added benefit of eliminating the need for precoating the susceptor as is sometimes conventionally carried out to inhibit slip.

Such precoating of the susceptor involves the loading of the susceptor with dummy wafers, followed by lowering the susceptor into the deposition chamber and depositing a small amount of silicon, e.g., 10–30 $\mu$m, on the susceptor and the dummy wafers (which are loaded into the pockets of the susceptor to shield the pockets during this precoating step). The precoated susceptor is then removed from the deposition chamber, the dummy wafers are removed, and the wafers on which the epitaxial layer is to be grown are loaded onto the wafer. This precoating of the susceptor changes the emissivity of the susceptor during the initial portion of the deposition, thus preventing thermal stress which would induce slippage.

The disadvantage of such a precoating is the additional steps needed to load and unload the dummy wafers as well as the additional deposition step, all of which take time and, therefore, reduce the throughput of the deposition chamber.

In accordance with another aspect of the invention, after the deposition, and prior to a cooling of the wafer below the deposition temperature, a post deposition etch gas is flowed into the chamber to remove any bridging materials which may have deposited between the wafer and the susceptor during the formation of the epitaxial layer.

This post deposition etching step (post etch step), which commences after the flow of deposition gas has been shut off, is carried out for a period of time ranging from 1 to as much as 15 minutes, preferably from about 3 to about 8 minutes, and typically for a period of time of between about 4 to about 6 minutes, depending upon the thickness of the epitaxial layer, since this will affect the extent of the deposition of bridging materials between the wafer and the susceptor at the point of contact, as previously discussed. After the post etch step, the wafer may then be conventionally processed, e.g., be allowed to cool and then removed from the deposition chamber.

The post etch gas may comprise any gas capable of removing the bridging materials deposited between the wafer and the susceptor, without substantially attacking the susceptor materials (usually silicon carbide on graphite) or the newly formed epitaxial layer. It is also important that the post etch gas not contain nitrogen, oxygen, or water vapor for other processing reasons. The post etch gas must also be a high purity gas, i.e., of at least semiconductor grade purity of 99.999%.

In accordance with the invention, it has been found that HCl gas comprise a post etch gas capable of removing such bridging materials without materially attacking the deposited epitaxial layer. For example, when an epitaxial layer of silicon has been grown, for the post etch time and concentration of post etch gas used, less than about 0.5 $\mu$m of silicon will be removed from the epitaxial layer.

The post etch step is carried out by flowing HCl gas, after cessation of the semiconductor deposition gas flow, into the deposition chamber, while continuing to flow the carrier gas through the chamber. The rate of flow of the post etch gas will also vary somewhat depending upon the total number and size (diameter) of the semiconductor wafers in the chamber, desired post etch rate, size of the deposition chamber, etc.

For example, for the post etching of 18 wafers, each having a diameter of 5 inches, the flow of post etch gas into a 70 liter deposition chamber will range from about 1 to about 40 slm, while the main flow of $H_2$ carrier gas will range from about 25 to about 70 slm, and the rotational $H_2$ carrier gas flow will range from 0 to about 40 slm.

As stated above, it is important that the post etch step be carried out at a temperature which is not below the wafer temperature used for the deposition, i.e., before the wafer cools to a temperature below the epitaxial deposition temperature. Preferably the post etch step should be carried out at the same temperature as the epitaxial deposition temperature, provided that the epitaxial deposition temperature is at least about 1150° C. This is to prevent thermal stress from being induced into the wafer during any cooling prior to removal of the bridging materials. Such thermal stress should not occur prior to any cooling of the wafer, since the difference in respective thermal expansion coefficients of the wafer and susceptor materials (which will result in the generation of the thermal stress) will only become a factor as the wafer heats or cools.

While carrying out the post etch at the same temperature as the deposition temperature is preferred, if a deposition temperature is used below about 1150° C., the minimum post etch temperature, the wafer temperature may be ramped up to about 1150° C. to carry out the post etch step. However, even in such a case, the deposition step temperature and post etch temperature should not be more than about 200° C. apart.

Thus, in any event the wafer should not be allowed to cool below the epitaxial deposition temperature prior to the post etch step, but if the epitaxial deposition temperature is below the minimum post etch temperature of 1150° C. by not more than about 200° C., the temperature of the wafer may be raised to the minimum post etch temperature without harm.

To further illustrate the practice of the invention, the following experiments were carried out.

EXAMPLE I

A group of eighteen 5" diameter silicon wafers were respectively loaded in the upper, middle, and bottom pockets of a six sided vertical susceptor in a 70 liter epitaxial deposition chamber. Prior to loading the wafers into the susceptor, the susceptor was provided with a 20 μm precoating of silicon.

Three of the eighteen wafers (one wafer in an upper pocket, one in a middle pocket, and one in a lower pocket) were loaded in a "forcing" condition orientation where a flat on the wafer faced downward, a position known to be particularly subject to inducement of wafer bridging, apparently due to the stronger surface contact between the wafer and the pocket.

The wafers were heated, via radiant heaters surrounding the quartz deposition chamber, to a deposition temperature of about 1170° C. $H_2$ carrier gas was flowed into the main inlet ports of the deposition chamber at a rate of about 65 slm, while rotational $H_2$ gas was flowed into the chamber at a rate of about 60 slm. When the wafers reached the deposition temperature, trichlorosilane ($SiHCl_3$) gas was also flowed into the chamber through the main inlet ports at a rate of about 25 slm while the susceptor was rotated at a speed of about 1.8 RPM. The deposition was carried out for about 80 minutes resulting in the epitaxial growth of about 116 μm of silicon on the wafers.

The gas flows were then shut off and the heaters turned off to allow the wafers to cool. Upon reaching room temperature, the wafers were removed from the deposition chamber and the epitaxial layer was examined for slip and microcracking, using a Nomarski Phase Contrast microscope at about 20x. Four of the eighteen wafers showed microcracking, including the three wafers in the "forced" condition. All of the wafers showed heavy slippage.

Epitaxial layers were then grown on a second group of eighteen wafers under the same conditions as just described above, except that after the trichlorosilane deposition gas was shut off, and before the wafers were allowed to cool, in accordance with the invention, 5 slm of HCl post etch gas was flowed into the chamber while continuing both $H_2$ gas flows. The flow of HCl etch gas was maintained for 1 minute, after which the gas flows were shut off and the wafers allowed to cool. The wafers were then examined for microcracking and slippage after reaching room temperature. The same deposition and post etch procedures were repeated for three further runs of eighteen wafers, with the post etch time extended to 3 minutes for the next run, and then to 5 minutes for the last two runs, which differed from one another slightly in the thickness of the epitaxial layer. The results are shown in Table I below.

TABLE I

| Run | Epitaxial Thickness | Etch Time | Wafer Cracking | Slippage |
|---|---|---|---|---|
| 1 | 116 μm | 0 | 4/18 | Heavy |
| 2 | 118 μm | 1 Min | 3/18 | Medium |
| 3 | 109 μm | 3 Min | 3/18 | Medium |
| 4 | 110 μm | 5 Min | 0/18 | Lightest |
| 5 | 117 μm | 5 Min | 0/18 | Light |

From the above table, it can be seen that with even as little as 1 minute of post deposition etching, only three of the wafers showed microcracking and the slippage was reduced. Furthermore, it must be pointed out that the three wafers showing microcracking, respectively with 1 and 3 minutes of post etching, were the wafers in the "forced" position. With a 5 minute post etch, the microcracking was eliminated in even the wafers in the "forced" positions.

EXAMPLE II

To illustrate the use of the low growth nucleation aspect of the invention, and to show that the need to precoat the susceptor can be eliminated thereby, epitaxial layers were grown on six further runs of nine 5" diameter silicon wafers using similar processing to that used in Example I except that the deposition temperature was raised to 1180° C., the susceptor rotation was 3 rpm, and the standard deposition rate was at 1.3 μm per minute, with a 3 minute post etch used after each deposition (except run 8) using 5 slm of HCl post etching gas. The total average thickness of the epitaxial layers in each run averaged about 110 μm. When the low growth nucleation was used (runs 10 and 11), the initial deposition rate was slowed to 0.5 μm per minute by lowering the flow rate of the trichlorosilane down to 8 slm for the first 12 minutes of the deposition. Precoating of the susceptor was also used in runs 8 and 9. The results are shown in Table II below.

TABLE II

| Run | Susceptor Coating | Low Growth Nucleation | Wafer Cracking | Slippage |
|---|---|---|---|---|
| 6 | None | No | 7/9* | Heavy |
| 7 | None | No | 2/9 | Heavy |
| 8 | 6 μm | No | 0/9 | Very Light |
| 9 | 105 μm | No | 0/9 | Medium-Light |
| 10 | None | 6 μm | 0/9 | Very Light |
| 11 | None | 6 μm | 0/9 | Very Light |

*No Post Etching

It will be noted that when the low growth nucleation of the invention is initially used (runs 10 and 11), even the susceptor precoating may be dispensed with, thus eliminating the extra processing previously necessary to form this precoating on the susceptor.

Thus, the invention provides a process wherein both slip and microcracking can be inhibited or eliminated by inhibiting the formation of thermal stress in the wafer during subsequent cooling of the wafer after formation of an epitaxial layer thereon. Use of an initial low growth rate influences the type of crystal growth or nucleation and inhibits the deposition of bridging materials which cause thermal stress upon subsequent cooling of the wafer. When epitaxial growth of over 50 μm thickness is used, a subsequent etch, after the deposition, but prior to cooling of the wafer below the epitaxial deposition temperature, will remove any bridging materials which have deposited.

When an initial low growth or deposition rate is used together with a post deposition etch, removal of the bridging materials by the etch is facilitated by the type of crystal growth induced by the nucleation which occurs when such low growth is also used. The result is the inhibition or elimination of both slip and microcracking, regardless of the thickness of the epitaxial layer grown on the wafer, by such inhibition or elimination of thermal stress in the wafer, even when precoating of the susceptor is not used.

Having thus described the invention what is claimed is:

1. A process for inhibiting thermal stress in a semiconductor wafer during a process for forming an epitaxial layer thereon which comprises post etching said wafer after growth of said epitaxial layer thereon, but prior to cooling of said wafer below the epitaxial deposition temperature, to thereby remove any materials capable of inducing thermal stress in said wafer as said wafer subsequently cools.

2. The process of claim 1 wherein said wafer is post etched by exposure to gaseous HCl at a temperature of from about 1150° C. to about 1250° C. after said layer has been epitaxially grown on said wafer.

3. The process of claim 1 wherein said post etching of said wafer with gaseous HCl removes a sufficient amount of any bridge materials formed between said wafer and a susceptor on which said wafer rests during said process for forming said epitaxial layer on said wafer to inhibit inducement of thermal stress in said wafer as said wafer subsequently cools.

4. The process of claim 3 wherein said process for forming an epitaxial layer on said wafer is initially carried out at a lower growth rate to inhibit growth of any bridge materials between said wafer and said susceptor and to promote deposition and growth of said epitaxial layer in a manner which will facilitate subsequent removal of any bridge formed between said wafer and said susceptor.

5. The process of claim 4 wherein said lower growth rate of said epitaxial layer is carried out by reducing the growth rate to less than 1 μm per minute.

6. The process of claim 5 wherein said lower growth rate is carried out until from about 2 to about 30 μm of semiconductor material has epitaxially grown on said wafer.

7. The process of claim 6 wherein said growth rate is then increased to at least about 1 μm per minute after said initial lower growth rate.

8. The process of claim 4 wherein said epitaxial deposition is carried out while maintaining said wafer at a temperature ranging from about 800° C. to about 1250° C.

9. The process of claim 4 wherein said HCl post etch further comprises flowing from about 1 to about 40 slm of gaseous HCl into a deposition chamber containing said wafer after said epitaxial layer has been grown on said wafer, while maintaining said wafer at a temperature of from about 1150° C. to about 1250° C., and prior to cooling of said wafer below the epitaxial deposition temperature.

10. The process of claim 9 wherein said HCl post etch further comprises flowing from about 5 to about 250 slm of $H_2$ gas into said deposition chamber.

11. The process of claim 9 wherein said HCl post etch process is carried out for from about 1 to about 15 minutes.

12. The process of claim 9 wherein said HCl post etch process is carried out for from about 3 to about 8 minutes.

13. The process of claim 9 wherein said HCl post etch process is carried out for from about 4 to about 6 minutes.

14. A process for forming an epitaxial layer on a semiconductor wafer in a deposition chamber while inhibiting thermal stress in said wafer which comprises:
 a) initially growing said epitaxial layer on said wafer at a rate of less than 1 μm per minute while heating said wafer;
 b) then increasing the growth rate to at least about 1 μm per minute for the duration of the epitaxial deposition; and
 c) then post etching said wafer at a temperature of from about 1150° C. to about 1250° C., after formation of said epitaxial layer thereon, but prior to cooling of said wafer below the epitaxial deposition temperature, to thereby remove any materials capable of inducing thermal stress in said wafer as said wafer subsequently cools.

15. The process of claim 14 wherein said initial growth at a rate of less than 1 μm per minute is carried out until said epitaxial layer is about 2 to about 30 μm in thickness.

16. The process of claim 14 wherein said initial epitaxial growth rate from about 0.1 μm per minute to less than 1 μm per minute until said epitaxial layer is about 2 to about 30 μm in thickness.

17. The process of claim 16 wherein said epitaxial deposition steps include flowing a gaseous source of silicon and a carrier gas into said deposition chamber containing said wafer.

18. The process of claim 17 wherein said carrier gas comprises $H_2$ and said gaseous source of silicon is selected from the group consisting of silicon-tetrachloride, trichlorosilane, and dichlorosilane.

19. The process of claim 16 wherein said deposition steps are carried out while maintaining said wafer at a temperature within a range of from about 800° C. to about 1250° C.

20. The process of claim 16 wherein said step of post etching said wafer further comprises flowing HCl into said deposition chamber.

21. The process of claim 20 wherein said post etching step is carried out for a period of from about 1 to about 15 minutes.

22. The process of claim 20 wherein said post etching step is carried out for a period of from about 3 to about 8 minutes.

23. The process of claim 20 wherein said post etching step is carried out for a period of from about 4 to about 6 minutes.

24. A process for forming an epitaxial layer on a semiconductor wafer in a deposition chamber while inhibiting thermal stress in said wafer to prevent the occurrence of either slip or microcracking of said wafer which comprises:
  a) initially growing said epitaxial layer on said wafer at a rate of from about 0.1 μm per minute up to less than 1 μm per minute to a thickness of from about 2 μm to abut 30 μm, while heating said wafer to a temperature of from about 800° C. to about 1250° C.;
  b) then increasing the growth rate to at least about 1 82 m per minute for the duration of the epitaxial deposition, while maintaining the same deposition temperature; and
  c) then post etching said wafer at a temperature of from about 1150° C. to about 1250° C. after said epitaxial deposition thereon, but prior to cooling of said wafer below said epitaxial deposition temperature, by flowing NCl etching gas into said chamber for a period of from about 1 to about 15 minutes, to thereby remove any bridging materials capable of inducing thermal stress in said wafer as said wafer subsequently cools.

* * * * *